(12) United States Patent
Yin et al.

(10) Patent No.: US 8,829,642 B2
(45) Date of Patent: Sep. 9, 2014

(54) SEMICONDUCTOR DEVICE AND METHOD FOR MANUFACTURING THE SAME

(75) Inventors: Haizhou Yin, Poughkeepsie, NY (US); Wei Jiang, Beijing (CN)

(73) Assignee: The Institute of Microelectronics, Chinese Academy of Science, Beijing (CN)

( * ) Notice: Subject to any disclaimer, the term of this patent is extended or adjusted under 35 U.S.C. 154(b) by 238 days.

(21) Appl. No.: 13/512,330

(22) PCT Filed: Apr. 9, 2012

(86) PCT No.: PCT/CN2012/000465
§ 371 (c)(1),
(2), (4) Date: May 26, 2012

(87) PCT Pub. No.: WO2013/143033
PCT Pub. Date: Oct. 3, 2013

(65) Prior Publication Data
US 2013/0256845 A1 Oct. 3, 2013

(30) Foreign Application Priority Data
Mar. 29, 2012 (CN) .......................... 2012 1 0088445

(51) Int. Cl.
*H01L 21/76* (2006.01)
*H01L 29/02* (2006.01)

(52) U.S. Cl.
USPC ........... 257/506; 438/435; 438/436; 438/437; 438/438

(58) Field of Classification Search
USPC .................... 438/435–438; 257/506
See application file for complete search history.

(56) References Cited

U.S. PATENT DOCUMENTS

| 5,190,889 | A  | * | 3/1993  | Poon et al. ................... | 438/437 |
| 5,780,346 | A  | * | 7/1998  | Arghavani et al. ............ | 438/296 |
| 6,153,480 | A  | * | 11/2000 | Arghavani et al. ............ | 438/296 |
| 6,303,413 | B1 | * | 10/2001 | Kalnitsky et al. ............. | 438/151 |
| 6,309,942 | B1 | * | 10/2001 | Tsui et al. .................... | 438/400 |
| 7,453,106 | B2 | * | 11/2008 | Takeoka et al. ............... | 257/262 |
| 7,579,255 | B2 | * | 8/2009  | Pyi .............................. | 438/424 |
| 7,727,856 | B2 | * | 6/2010  | Teo et al. ..................... | 438/434 |

(Continued)

FOREIGN PATENT DOCUMENTS

| CN | 1218988 A | 6/1999 |
| CN | 1233851 A | 11/1999 |

(Continued)

OTHER PUBLICATIONS

En et al., Reduction of STI/active Stress on 0.18 um SOI Devices Through Modification of STI Process, Oct. 2001, IEEE International SOI Conference, pp. 85-86.*

*Primary Examiner* — Evan Pert
(74) *Attorney, Agent, or Firm* — Treasure IP Group

(57) ABSTRACT

The present invention discloses a semiconductor device, which comprises: a substrate, and a shallow trench isolation in the substrate, characterized in that, the semiconductor device further comprises a stress release layer between the substrate and the shallow trench isolation. In the semiconductor device and the method for manufacturing the same according to the present invention, the stresses accumulated during the formation of the STI can be released by interposing the stress release layer made of a softer material between the substrate and the STI, thereby reducing the leakage current of the substrate of the device and improving the device reliability.

13 Claims, 2 Drawing Sheets

(56) References Cited

U.S. PATENT DOCUMENTS

| | | | |
|---|---|---|---|
| 7,871,897 B2* | 1/2011 | Shin et al. | 438/435 |
| 8,022,501 B2* | 9/2011 | Pyi | 257/522 |
| 2006/0110892 A1 | 5/2006 | Orlowski | |
| 2012/0146098 A1* | 6/2012 | Dahlstrom et al. | 257/197 |

FOREIGN PATENT DOCUMENTS

| | | |
|---|---|---|
| CN | 1450621 A | 10/2003 |
| CN | 1649122 A | 8/2005 |
| CN | 101123204 A | 2/2008 |

* cited by examiner

SEMICONDUCTOR DEVICE AND METHOD FOR MANUFACTURING THE SAME

CROSS-REFERENCE TO RELATED APPLICATION

This application is a National Stage application of, and claims priority to, PCT Application No. PCT/CN2012/000465, filed on Apr. 9, 2012, entitled "Semiconductor Device and Method for Manufacturing the Same", which claimed priority to Chinese Application No. 201210088445.0, filed on Mar. 29, 2012. Both the PCT Application and Chinese Application are incorporated herein by reference in their entireties.

FIELD OF THE INVENTION

The present invention relates to a semiconductor device and a method for manufacturing the same, and in particular, to a semiconductor device that can effectively release stresses from a STI and a method for manufacturing the same.

BACKGROUND OF THE INVENTION

In the conventional bulk silicon CMOS, a pn junction is formed between the well region and the substrate, while a pn junction is also formed between the source and drain regions and the substrate in the MOSFET. These parasitic controlled silicon structures may cause a high leakage current between the power source and ground under certain conditions, thereby generating a latch-up effect. Especially under the logic circuit technology node of 0.25 μm, such parasitic latch-up effect greatly hinders further improvement of the semiconductor device performance.

One of the methods that can effectively prevent the latch-up effect is to adopt the Shallow Trench Isolation (STI) technique. The parasitic electrical connection that might be formed between the NMOS and PMOS devices can be discontinued by the shallow trench isolation that is insulated and filled with, for example, silicon oxide, thereby increasing the device reliability. In addition, as compared to the local oxidation of silicon process (LOCOS), the STI occupies a shorter width of the channel and has a smaller isolation pitch, thus it will not erode the active region, thereby avoiding the Bird's Beak effect of LOCOS. Moreover, the isolation structures formed by the STI are mostly located under the surface of the substrate, which will facilitate the planarization of the entire surface of the device.

However, the existing STI may accumulate stresses during the formation of the STI, and the accumulated stresses may cause defects, such as dislocation, to the substrate. These defects would be used as the recombination centers of the electron-hole pairs during the operation of the device, thereby increasing the leakage current of the substrate of the device.

Therefore, it is desired to release the stresses accumulated during the formation of the STI so as to avoid the above-mentioned problem.

SUMMARY OF THE INVENTION

In view of the above, an object of the present invention is to provide a semiconductor device that can effectively release stresses from a STI and a method for manufacturing the same.

To achieve the above object, the present invention provides a semiconductor device, which comprises: a substrate, and a shallow trench isolation in the substrate, characterized in that, the semiconductor device further comprises a stress release layer between the substrate and the shallow trench isolation.

Preferably, the stress release layer comprises one of BSG and BPSG. Preferably, the thickness of the stress release layer is about 10-15 nm.

Preferably, the semiconductor device further comprises a liner between the stress release layer and the substrate. Preferably, the liner includes at least a first liner of oxide and a second liner of nitride.

Preferably, a semiconductor device structure is formed in an active region surrounded by the shallow trench isolation.

The present invention also provides a method for manufacturing a semiconductor device, which comprises: forming a shallow trench in a substrate; forming a stress release layer in the shallow trench; filling the shallow trench with an insulating material to form a shallow trench isolation; and performing an annealing to turn the stress-relieving layer viscous so as to relax stress.

Preferably, the stress release layer comprises one of BSG and BPSG. Preferably, the thickness of the stress release layer is about 10-15 nm.

Preferably, after forming the shallow trench and before forming the stress release layer, the method further comprises forming a liner in the shallow trench. Preferably, the liner includes at least a first liner of oxide and a second liner of nitride.

Preferably, the annealing is performed at a temperature higher than about 600° C.

Preferably, forming a shallow trench in the substrate comprises: forming a hard mask layer on the substrate; photoetching/etching the hard mask layer to form a hard mask layer pattern which has an opening exposing the substrate; and etching the substrate exposed in the opening with the hard mask layer pattern as a mask to form a shallow trench, the bottom surface of which is lower than the upper surface of the substrate. Preferably, the hard mask layer includes at least a first hard mask layer of oxide and a second hard mask layer of nitride.

Preferably, after performing an annealing, the method further comprises forming a semiconductor device structure in an active region surrounded by the shallow trench isolation.

In the semiconductor device and the method for manufacturing the same according to the present invention, the stresses accumulated during the formation of the STI can be released by interposing the stress release layer made of a softer material between the substrate and the STI, thereby reducing the leakage current of the substrate of the device and improving the device reliability.

BRIEF DESCRIPTION OF THE DRAWINGS

The technical solutions of the present invention will be described in detail below with reference to the accompanying drawings, wherein.

DETAILED DESCRIPTION OF THE PREFERRED EMBODIMENTS

The features and technical effects of the technical solutions of the present invention will be described in detail below with reference to the drawings and in combination with exemplary embodiments. A semiconductor device that can effectively release stresses from a STI and a method for manufacturing the same are disclosed. It shall be noted that like reference signs denote like structures, and the terms used in the present invention, such as "first", "second", "above", "below", and the like, can be used to modify various device structures or manufacturing processes. Unless specified otherwise, such modification does not imply the spatial, sequential or hierarchical relationships between the device structures or manufacturing processes.

The various steps of the method for manufacturing the device according to the present invention will be described in detail below with reference to the schematic cross-sectional views of FIGS. 1-4.

Figure 1:
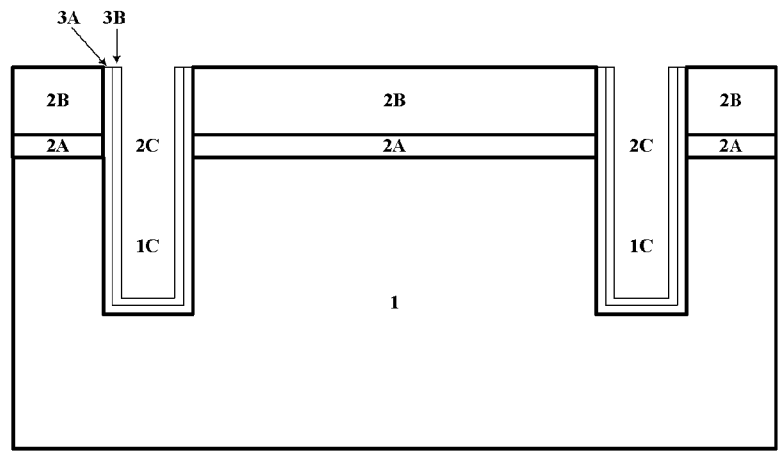
FIGS. 1-4 are schematic cross-sectional views of the various steps of a method for manufacturing a semiconductor device according to the present invention.

Referring to FIG. 1, a hard mask layer 2 is formed on a substrate 1. The hard mask layer 2 and the substrate 1 are photoetched/etched to form a shallow trench. A liner 3 is deposited the shallow trench.

The substrate 1 may be provided and appropriately selected according to the requirements for the application of the device. The material used as the substrate 1 may comprise one of monocrystal silicon (Si), Silicon On Insulator (SOI), monocrystal germanium (Ge), Germanium On Insulator (GeOI), strained silicon (strained Si), silicon germanium (SiGe), compound semiconductor materials, such as gallium nitride (GaN), gallium arsenide (GaAs), indium phosphide (InP), and indium antimonide (InSb), and carbon-based semiconductor, such as graphene, SiC, and carbon nanotube, etc. Preferably, the substrate 1 may be bulk silicon, e.g. a Si wafer, and SOI, so as to be compatible with the CMOS technology to apply to a digital logic integrated circuit.

The hard mask layer 2 is deposited on the substrate 1 and is photoetched/etched to form a hard mask layer pattern having an opening that expose a part of the substrate 1. The hard mask layer may be a single layer or multi-layer. Preferably, the hard mask layer includes at least a first hard mask layer 2A of oxide, e.g. silicon oxide, and a second hard mask layer 2B of nitride, e.g. silicon nitride, or oxynitride, e.g. silicon oxynitride. By using such stacked hard mask layer, the precision of the etched pattern can be well controlled, and the surface of the substrate to be etched and covered by the stacked hard mask layer can be well protected. A photoresist (not shown) is spin coated and is exposed and developed to form a photoresist pattern. A hard mask layer opening 2C is formed by performing anisotropic etching in the hard mask layer 2A/2B by means of dry etching, such as plasma etching, using the photoresist pattern as a mask, until the substrate 1 is exposed. At this time, the surface of the substrate 1 is not over-etched due to the stacked structure of the hard mask layer, so the defect density of the surface is not increased. Although the opening 2C is shown as two sections in the cross-sectional view, it actually surrounds the active region of the device, namely, it is of a ring-shaped structure in the top view (not shown), for example, a rectangular ring frame.

The part of substrate 1 exposed in the opening is etched using the hard mask layer pattern as a mask until reaching a certain depth H under the surface of the substrate 1. Preferably, the substrate 1 may be etched in an anisotropic manner by means of dry etching When the material of the substrate 1 is Si, a solution having good anisotropy used for wet etching, such as TMAH, may also be used for the etching As shown in FIG. 1, an opening 1C is also formed in the substrate 1 so as to form a shallow trench. The opening 1C has the same width W as the opening 2C. The depth H of the opening 1C of the substrate 1 that is from the top surface of the substrate 1 to the bottom surface of the opening 1C is smaller than the thickness of the substrate 1. For example, the depth H of the opening 1C is smaller than or equal to about $2/3$ of the thickness of the substrate 1, depending on the specific requirements for the insulation property of the device. The width W of the openings 1C and 2C (shallow trench) is smaller than the depth H thereof. For example, the width W is only about $1/5$-$1/3$ of the depth H.

Preferably, the liner 3 may be deposited in the shallow trench by means of a conventional depositing method, such as LPCVD, PECVD, HDPCVD, and ALD, etc., so as to eliminate defects on the surface of the shallow trench in the substrate. Preferably, the liner 3 may comprise a stacked structure which includes at least a first liner 3A of oxide and a second liner 3B of nitride. The total thickness of the liner 3A/3B is, for example, about 10-20 nm. If the parameters in the etching process are well controlled to avoid causing excess defects of the substrate, the liner 3 may also be omitted.

Figure 2:
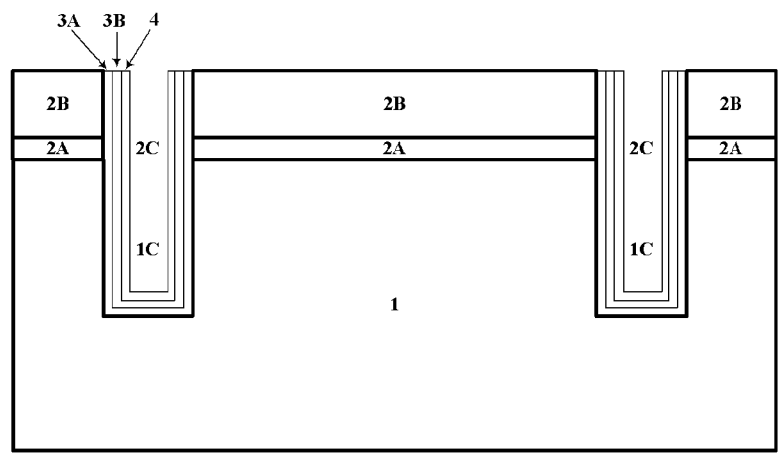

Referring to FIG. 2, a stress release layer 4 is formed on the inner surface of the shallow trench. The stress release layer 4 is deposited on the bottom surface and side surface of the shallow trench (the opening 1C) and on the side surface of the opening 2C by using a conventional depositing method, such as LPCVD, PECVD, HDPCVD and ALD. A softer material is used as the material of the stress release layer 4, namely, the softer material becomes less sticky under a low temperature of, for example, 600° C., so that the stresses are released via flowing so as to prevent the strained STI from producing unnecessary stresses in the substrate areas adjacent to the STI. Appropriate materials for the stress release layer 4 include one of borosilicate glass (BSG), and boron-phosphorous silicate glass (BPSG) and the like. The thickness of the stress release layer 4 may be preferably about 10-15 nm, which is sufficient for releasing stresses and is not too thin to reduce the insulating property of the STI at the same time.

Figure 3:
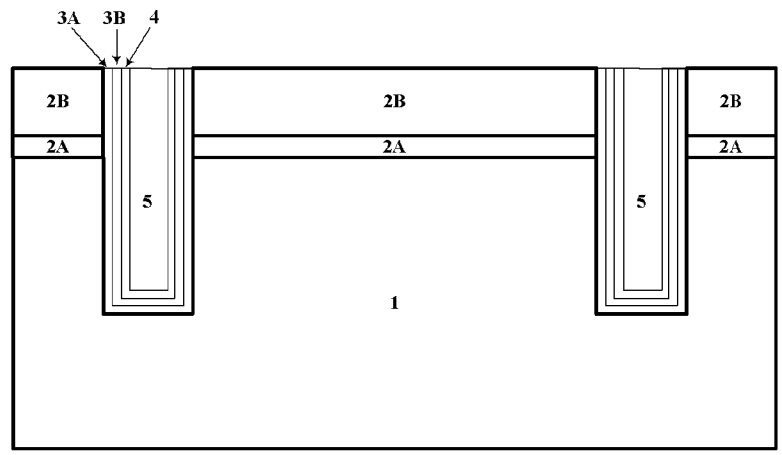

Referring to FIG. 3, the stress release layer 4 in the shallow trench is filled with an insulating material to form a shallow trench isolation (STI) 5. The shallow trench is filled by depositing an insulating material of silicon oxide using a conventional depositing method, such as LPCVD, PECVD, HDPCVD and ALD, so as to form the STI 5. The insulating material is planarized, for example, by CMP until the hard mask layer 2A/2B is exposed. Subsequently, an annealing is performed at a temperature higher than 600° C., so that the stress release layer 4 is heated to enable rheidity thereof, thereby releasing the stresses accumulated during depositing the STI 5.

Figure 4:
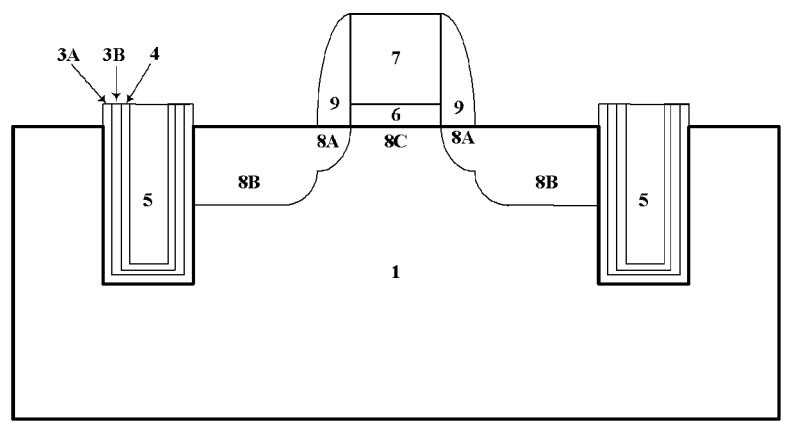

Referring to FIG. 4, the hard mask layer 2A/2B is removed to form a semiconductor device structure in the active region surrounded by the STI 5. For example, the hard mask layer 2A/2B is removed by wet etching or dry etching A gate stack comprising a pad oxide layer (e.g. silicon oxide, not shown), a gate insulating layer 6 (e.g. high k material), a gate conductive layer 7 (e.g. doped polysilicon, metal, metal alloy, metal nitride) is formed on the surface of the active region of the substrate 1 surrounded by the STI 5 by performing deposition and etching on the surface of the active region. A first ion implantation is performed on a source and drain using the gate stack as a mask to form lightly doped source and drain extension regions 8A. Gate spacers 9 made of silicon nitride are formed on the second epitaxial layer 3 on both sides of the gate stack. A second ion implantation is performed on the source and drain using the gate spacers 9 as a mask to form heavily doped source and drain regions 8B. A channel region 8C is composed of a part of the second epitaxial layer 3 between the source and drain regions 8A/8B. A self-alignment process is performed using a silicide on the source and drain regions 8B to form a metal silicide (not shown) so as to reduce the source and drain resistances. An interlayer dielectric layer (not shown) that is formed from a low-k material, such as silicon oxide, is formed on the entire device. The interlayer dielectric layer is etched to form a contact hole that directly reaches the metal silicide. The contact hole is filled with a metal to form a contact plug (not shown).

The finally formed semiconductor device, as shown in FIG. 4, comprises: a substrate, a shallow trench isolation in the substrate, an active region surrounded by the shallow trench, and a semiconductor device structure formed in the active region, wherein the semiconductor device further comprises a stress release layer between the substrate and the shallow trench isolation. Preferably, there may be also a liner between the stress release layer and the substrate. The materials and forming processes of the remaining components have been previously described in detail and will not be repeated any more here.

In the semiconductor device and the method for manufacturing the same according to the present invention, the stresses accumulated during the formation of the STI can be released by interposing the stress release layer made of a softer material between the substrate and the STI, thereby reducing the leakage current of the substrate of the device and improving the device reliability.

Although the present invention has been illustrated with reference to one or more exemplary embodiments, it shall be understood by those ordinary skilled in the art that various appropriate changes and equivalents can be made to the device structure without departing from the scope of the present invention. In addition, many modifications that might be adapted to specific situations or materials can be made from the teaching disclosed by the present invention without departing from the scope thereof. Therefore, the present invention is not intended to be limited to the specific embodiments which are disclosed as preferred implementations to carry out the invention, but the disclosed device structure and the method for manufacturing the same will include all embodiments that fall into the scope of the present invention.

What is claimed is:

1. A semiconductor device, comprising: a substrate, and a shallow trench isolation in the substrate, wherein the semiconductor device further comprises a stress release layer between the substrate and the shallow trench isolation,
wherein the semiconductor device further comprises a liner between the stress release layer and the substrate; and
wherein the liner includes at least a first liner of oxide and a second liner of nitride.

2. The semiconductor device according to claim 1, wherein the stress release layer comprises one of BSG and BPSG.

3. The semiconductor device according to claim 1, wherein the thickness of the stress release layer is about 10-15 nm.

4. The semiconductor device according to claim 1, wherein a semiconductor device structure is formed in an active region surrounded by the shallow trench isolation.

5. A method for manufacturing a semiconductor device, comprising:
forming a shallow trench in a substrate;
forming a stress release layer in the shallow trench;
filling the shallow trench with an insulating material to form a shallow trench isolation; and
performing an annealing step to enable rheidity of the stress release layer so as to release stresses.

6. The method for manufacturing a semiconductor device according to claim 5, wherein the stress release layer comprises one of BSG and BPSG.

7. The method for manufacturing a semiconductor device according to claim 5, wherein the thickness of the stress release layer is about 10-15 nm.

8. The method for manufacturing a semiconductor device according to claim 5, wherein after forming the shallow trench and before forming the stress release layer, the method further comprises forming a liner in the shallow trench.

9. The method for manufacturing a semiconductor device according to claim 8, wherein the liner includes at least a first liner of oxide and a second liner of nitride.

10. The method for manufacturing a semiconductor device according to claim 5, wherein the annealing is performed at a temperature higher than 600° C.

11. The method for manufacturing a semiconductor device according to claim 5, wherein forming a shallow trench in the substrate comprises:
forming a hard mask layer on the substrate;
photoetching/etching the hard mask layer to form a hard mask layer pattern which has an opening exposing the substrate; and
etching the substrate exposed in the opening with the hard mask layer pattern as a mask to form a shallow trench, the bottom surface of which is lower than the upper surface of the substrate.

12. The method for manufacturing a semiconductor device according to claim 11, wherein the hard mask layer includes at least a first hard mask layer of oxide and a second hard mask layer of nitride.

13. The method for manufacturing a semiconductor device according to claim 5, wherein after performing an annealing, the method further comprises forming a semiconductor device structure in an active region surrounded by the shallow trench isolation.

* * * * *